(12) United States Patent
Jeng et al.

(10) Patent No.: US 9,520,372 B1
(45) Date of Patent: Dec. 13, 2016

(54) WAFER LEVEL PACKAGE (WLP) AND METHOD FOR FORMING THE SAME

(71) Applicant: TAIWAN SEMICONDUCTOR MANUFACTURING CO., LTD., Hsin-Chu (TW)

(72) Inventors: Shin-Puu Jeng, Hsinchu (TW); Hsien-Wen Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/837,712

(22) Filed: Aug. 27, 2015

Related U.S. Application Data

(60) Provisional application No. 62/194,676, filed on Jul. 20, 2015.

(51) Int. Cl.
*H01L 29/40* (2006.01)
*H01L 23/00* (2006.01)
*H01L 23/48* (2006.01)

(52) U.S. Cl.
CPC ............ *H01L 24/05* (2013.01); *H01L 24/03* (2013.01); *H01L 2224/024* (2013.01); *H01L 2224/0401* (2013.01); *H01L 2224/05008* (2013.01); *H01L 2924/3511* (2013.01); *H01L 2924/3512* (2013.01); *H01L 2924/35121* (2013.01)

(58) Field of Classification Search
CPC .......... H01L 24/03; H01L 24/10; H01L 24/13; H01L 24/16; H01L 2224/00; H01L 2924/00014; H01L 2224/0401; H01L 24/05; H01L 2224/73204; H01L 2924/00; H01L 2224/05571; H01L 2224/04105; H01L 2224/48227
See application file for complete search history.

(56) References Cited

U.S. PATENT DOCUMENTS

| | | | |
|---|---|---|---|
| 5,116,939 A | 5/1992 | Fletcher et al. | |
| 8,362,612 B1 * | 1/2013 | Paek | H01L 24/03 257/737 |

(Continued)

OTHER PUBLICATIONS

Chen et al., "Synthesis and Characterization of Polyimide/Silica Hybrid Nanocomposites," Journal of Applied Polymer Science, vol. 94, 2004, ISSN 1097-4628, pp. 382-393.

(Continued)

*Primary Examiner* — Jasmine Clark
(74) *Attorney, Agent, or Firm* — Slater & Matsil, LLP

(57) ABSTRACT

A semiconductor device structure and method for forming the same are provided. The semiconductor device structure includes a substrate and a conductive pad formed on the substrate. The semiconductor device structure includes a protection layer formed over the conductive pad and a post-passivation interconnect (PPI) structure formed at least in the protection layer. The PPI structure is electrically connected to the conductive pad. The semiconductor device structure also includes a first moisture-resistant layer formed over the protection layer, and the protection layer and the first moisture-resistant layer are made of different materials. The semiconductor device structure further includes an under bump metallurgy (UBM) layer formed over the first moisture-resistant layer and connected to the PPI structure.

20 Claims, 20 Drawing Sheets

(56) References Cited

U.S. PATENT DOCUMENTS

| | | |
|---|---|---|
| 2010/0140752 A1 | 6/2010 | Marimuthu et al. |
| 2010/0193950 A1* | 8/2010 | Lee ..................... H01L 23/295 |
| | | 257/738 |
| 2011/0233766 A1 | 9/2011 | Lin et al. |
| 2014/0210099 A1 | 7/2014 | Hu et al. |
| 2014/0291844 A1* | 10/2014 | Ryu .................... H01L 23/5389 |
| | | 257/738 |
| 2014/0346665 A1 | 11/2014 | Lin et al. |

OTHER PUBLICATIONS

Sun et al, "Glass Transition and Relaxation Behavior of Epoxy Nanocomposites," Journal of Polym Sci Part B, Polym Phys, vol. 42, 2004, ISSN 1029-0488, pp. 3849-3858.

* cited by examiner

WAFER LEVEL PACKAGE (WLP) AND METHOD FOR FORMING THE SAME

CROSS REFERENCE TO RELATED APPLICATIONS

This Application claims the benefit of U.S. Provisional Application No. 62/194,676, filed on Jul. 20, 2015, and entitled "wafer level package (wlp) and method for forming the same", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

A wafer level package (WLP) structure is used as one of the package structures for semiconductor components of electronic products. An increased number of input-output (I/O) electrical contacts combined with increased demand for high performance integrated circuits (ICs) has led to the development of fan-out type WLP structures enabling larger pitches of bumps for the I/O electrical contacts.

Although existing WLP structures and methods of fabricating wafer-level packages have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1F' shows a modified embodiment of a semiconductor device structure, in accordance with some embodiments of the disclosure.

FIG. 3D' shows a modified embodiment of a semiconductor device structure, in accordance with some embodiments of the disclosure.

FIG. 5B' shows a cross-sectional representation of a semiconductor device structure, in accordance with some embodiments of the disclosure.

FIG. 6B' shows a cross-sectional representation of a semiconductor device structure, in accordance with some embodiments of the disclosure.

FIG. 7B' shows a cross-sectional representation of a semiconductor device structure, in accordance with some embodiments of the disclosure.

DETAILED DESCRIPTION

Figure 1A:
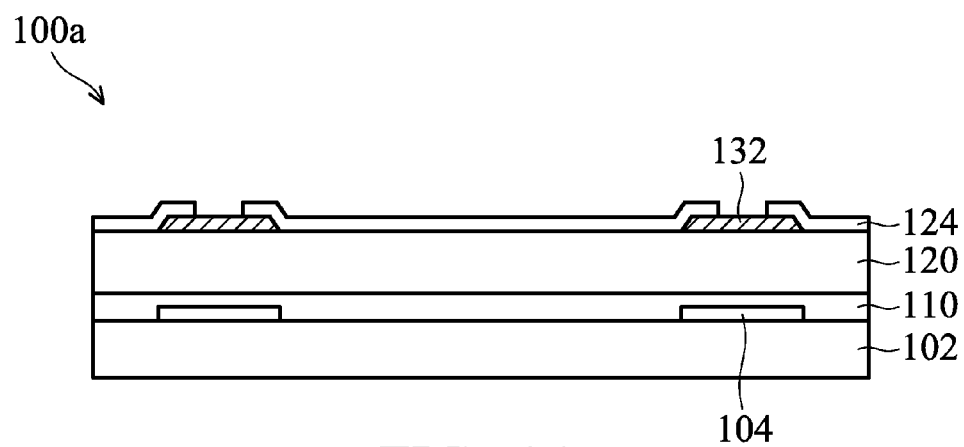
FIGS. 1A-1F show cross-sectional representations of various stages of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a semiconductor device structure and method for forming the same are provided. FIGS. 1A-1F show cross-sectional representations of various stages of forming a semiconductor device structure 100a, in accordance with some embodiments of the disclosure. The semiconductor device structure 100a is applied to wafer level package (WLP).

Referring to FIG. 1A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

The semiconductor device structure 100a also includes an inter-layer dielectric (ILD) layer 110 over the substrate. The ILD layer 110 is made of silicon oxide (SiOx), silicon nitride (SixNy) or silicon oxynitride (SiON).

The device elements 104 are formed in the ILD layer 110. The device elements 104 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements 104, such as deposition, etching, implantation, photolithography, annealing, and/or other applicable processes. In some embodiments, device elements 104 are formed in the substrate 102 in a front-end-of-line (FEOL) process.

The substrate 102 may include various doped regions such as p-type wells or n-type wells). Doped regions may be doped with p-type dopants, such as boron or $BF_2$, and/or n-type dopants, such as phosphorus (P) or arsenic (As). The doped regions may be formed directly on the substrate 102, in a P-well structure, in an N-well structure, or in a dual-well structure.

The substrate 102 may further include isolation features (not shown), such as shallow trench isolation (STI) features or local oxidation of silicon (LOCOS) features. Isolation features may define and isolate various device elements.

An inter-metal dielectric (IMD) layer 120 is formed over the ILD layer 110. The IMD layer 120 is made of silicon oxide (SiOx), silicon nitride (SixNy), silicon oxynitride (SiON), dielectric material(s) with low dielectric constant (low-k), or combinations thereof. In some embodiments, the IMD layer 120 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the IMD layer 120 is deposited by a plasma enhanced chemical vapor deposition (PECVD) process or by a spin coating process.

A conductive pad 132 is formed over the IMD layer 120. The conductive pad 132 is electrically connected to the device elements 104 through various metallic lines and vias in the IMD layer 120.

The IMD layer 120 and conductive pad 132 are formed in a back-end-of-line (BEOL) process. The conductive pad 132 is made of copper (Cu), copper alloy, aluminum (Al), aluminum alloy, tungsten (W), tungsten alloy, titanium (Ti), titanium alloy, tantalum (Ta) or tantalum alloy. In some embodiments, the conductive pad 132 is formed by a plating method.

A passivation layer 124 is formed over the IMD layer 120 and covers the edge portions of the conductive pad 132. In addition, the center portions of the conductive pad 132 are exposed. In some embodiments, the passivation layer 124 is made of non-organic materials, such as silicon oxide, un-doped silicate glass, silicon oxynitride, solder resist (SR), silicon nitride, HMDS (hexamethyldisilazane). In some other embodiments, the passivation layer 124 is made of a polymer material, such as polyimide (PI), epoxy, or fluorine (F)-containing polymer.

Figure 1B:
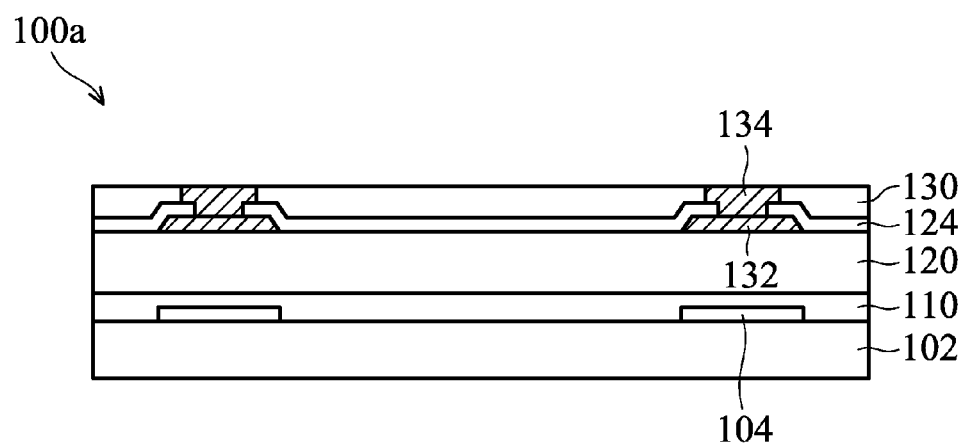

After the passivation layer 124 is formed, a first protection layer 130 is formed over the passivation layer 124 as shown in FIG. 1B, in accordance with some embodiments of the disclosure.

Afterwards, the first protection layer 130 is patterned by a patterning process to expose a portion of the conductive pad 132. The patterning process includes a photolithography process and an etching process. Examples of a photolithography process include soft baking, mask aligning, exposure, post-exposure baking, developing the photoresist, rinsing and drying (e.g., hard baking). The etching process may be a dry etching or a wet etching process.

In some embodiments, the first protection layer 130 is made of polybenzoxazole (PBO), benzocyclobuten (BCB), silicone, acrylates, siloxane, or combinations thereof. In some embodiments, the first protection layer 130 is able to provide high patterning resolution which allows the PPI interconnect structure (will be illustrated in FIG. 1D) formed thereon to have fine pith. A post-passivation interconnect (PPI) pad 134 is formed in the first protection layer 130, and it is electrically connected to the conductive pad 132. The PPI pad 134 is formed after the formation of the passivation layer 124. In some embodiments, the PPI pad 134 is called a redistribution layer (RDL) pad.

The PPI pad 134 is made of conductive material, such as copper (Cu), copper alloy, aluminum (Al), aluminum alloy, tungsten (W), tungsten alloy, titanium (Ti), titanium alloy, tantalum (Ta) or tantalum alloy. The PPI pad 134 is formed by plating, electroless plating, sputtering or chemical vapor deposition (CVD).

The PPI pad 134 is formed by filling a conductive material such as a metal material into openings and on the first protection layer 130. Afterwards, the excess conductive material is removed by a chemical mechanical polishing (CMP) process.

Figure 1C:
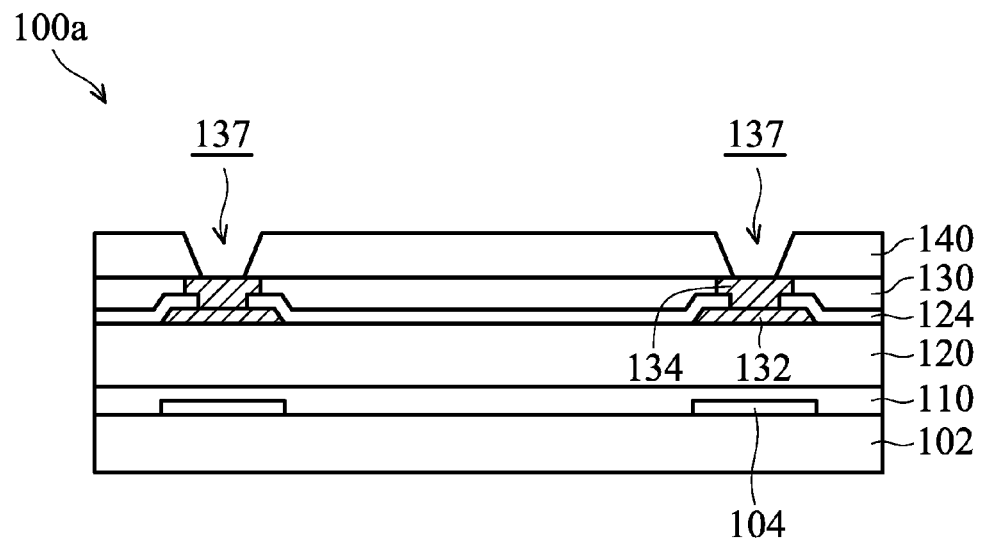

After the PPI pad 134 is formed, a second protection layer 140 is formed over the first protection layer 130 and the PPI pad 134 as shown in FIG. 1C, in accordance with some embodiments of the disclosure.

The second protection layer 140 is made of polybenzoxazole (PBO), benzocyclobuten (BCB), silicone, acrylates, siloxane, or combinations thereof.

After the second protection layer 140 is formed, the second protection layer 140 is patterned to form openings 137 by the patterning process. Therefore, at least a portion of the PPI pad 134 is exposed.

Figure 1D:
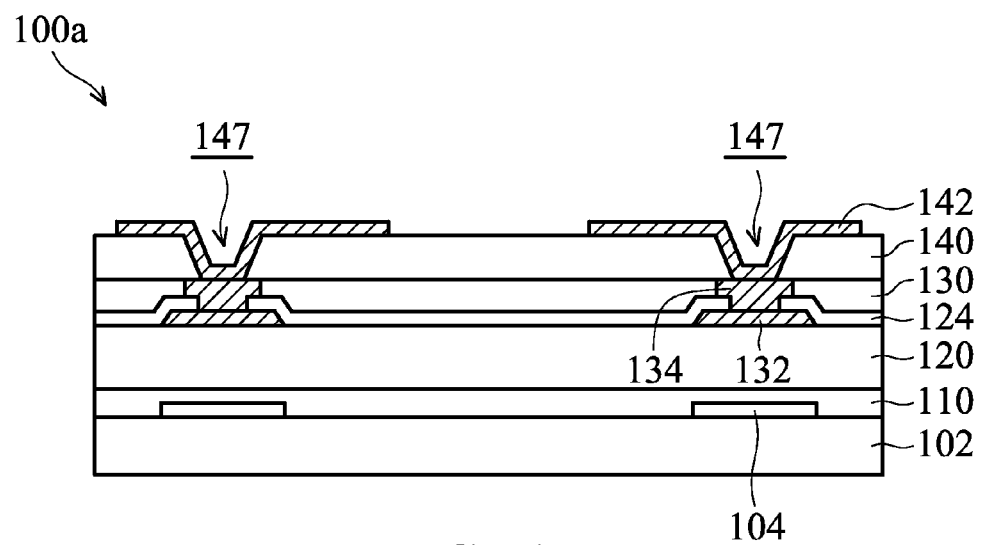

Afterwards, a PPI structure 142 is formed in the openings 137 and on the second protection layer 140 as shown in FIG. 1D, in accordance with some embodiments of the disclosure. The PPI structure 142 is electrically connected to the PPI pad 134. The PPI structure 142 is used to electrical connected to a different region of the substrate 102.

The PPI structure 142 is made of a conductive material, such as copper (Cu), copper alloy, aluminum (Al), aluminum alloy, tungsten (W), tungsten alloy, titanium (Ti), titanium alloy, tantalum (Ta) or tantalum alloy. The PPI structure 142 is formed by plating, electroless plating, sputtering or chemical vapor deposition (CVD).

Figure 1E:
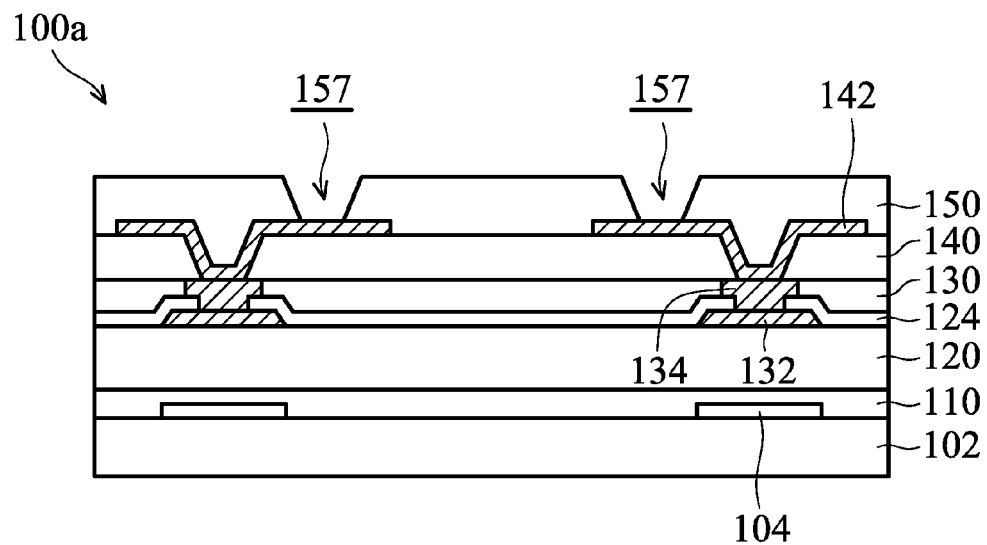

After the PPI structure 142 is formed, a first moisture-resistant layer 150 is formed as shown in FIG. 1E, in accordance with some embodiments of the disclosure. Afterwards, the first moisture-resistant layer 150 is patterned to form openings 157. A portion of the PPI structure 142 is exposed by the openings 157.

A first moisture-resistant layer 150 is formed over the device element 104 for preventing moisture penetration that may result in underlying protection layers and PPI structure delaminated. The formation of the first moisture-resistant layer 150 helps the semiconductor device structure 100a able to pass through extreme environments, such as various reliability tests, without moisture being able to penetrate. The first moisture resistant 150 layer has a water absorption that is lower than that of the protection layers 130 and 140. For example, the first moisture-resistant layer 150 has a water absorption ranging from about 0.5 wt % to about 2.5 wt %. Furthermore, the first moisture-resistant layer 150 has excellent mechanical properties, but it still has a sufficient stress buffer ability. In some embodiments, the first moisture-resistant layer 150 has a tensile modulus ranging from about 120 Mpa to about 250 Mpa at temperatures from about −55 degrees Celsius to room temperature. In some embodiments, the first moisture-resistant layer 150 has an elongation at break in a range from about 50% to about 100% at room temperature. In addition, in some embodiments, the first moisture-resistant layer 150 has an elongation at break in a range from about 40% to about 100% at −55 degrees Celsius.

In some embodiments, the first moisture-resistant layer 150 includes inorganic materials such as silicon nitride, silicon oxide, silicon oxynitride, HMDS (hexamethyldisilazane) or a combination thereof. Alternatively, the first moisture-resistant layer 150 includes a polymer, such as polyimide (PI), epoxy, solder resist (SR), fluorine (F)-containing polymer or combinations thereof. In some embodiments, the first moisture-resistant layer 150 is not made of PBO. In some embodiments, the first moisture-resistant layer 150 does not include PBO.

In some embodiments, when the first moisture-resistant layer 150 is made of a polymer, the polymer has a decomposition temperature (Td) ranging from about 250 degrees to about 400 degrees and a glass transition temperature (Tg) ranging from about 200 degrees to about 350 degrees, which allows the first moisture-resistant layer 150 to be robust enough but not too rigid and brittle.

In some embodiments, to meet the moisture resistant and stress buffer requirements described above, the polyimide (PI) has about 10 wt % to about 40 wt % of cross-links. In some embodiments, the cross-links include an alkoxy group (OR), where R includes C1-C20 alkyl, C3-C20 cycloalky, C6-C20 aryl, or C6-C20 aralkyl groups with or without branched chains. Likewise, the epoxy includes phenol resin or acrylic resin with a range from about 60 wt % to about 90 wt %; the solder resist (SR) includes silicate fillers in a range from about 10 wt % to about 30 wt %; or the fluorine-containing polymer includes carbon-fluorine (C—F) bonds in a range from about 30 wt % to about 60 wt %. The fluorine-containing layer may be made from a source of hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$) or combinations thereof.

In some embodiments, the first moisture-resistant layer 150 is made of the same material as the passivation layer 124. The second protection layer 140 and the first moisture-resistant layer 150 construct a moisture resistant hybrid structure for protecting the device element 104.

Figure 1F:
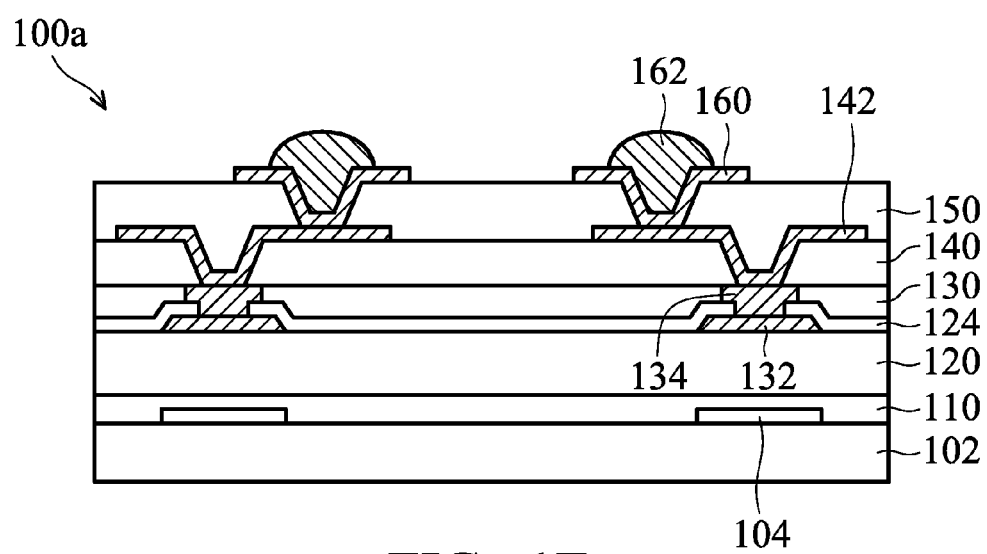
Figure 1F:
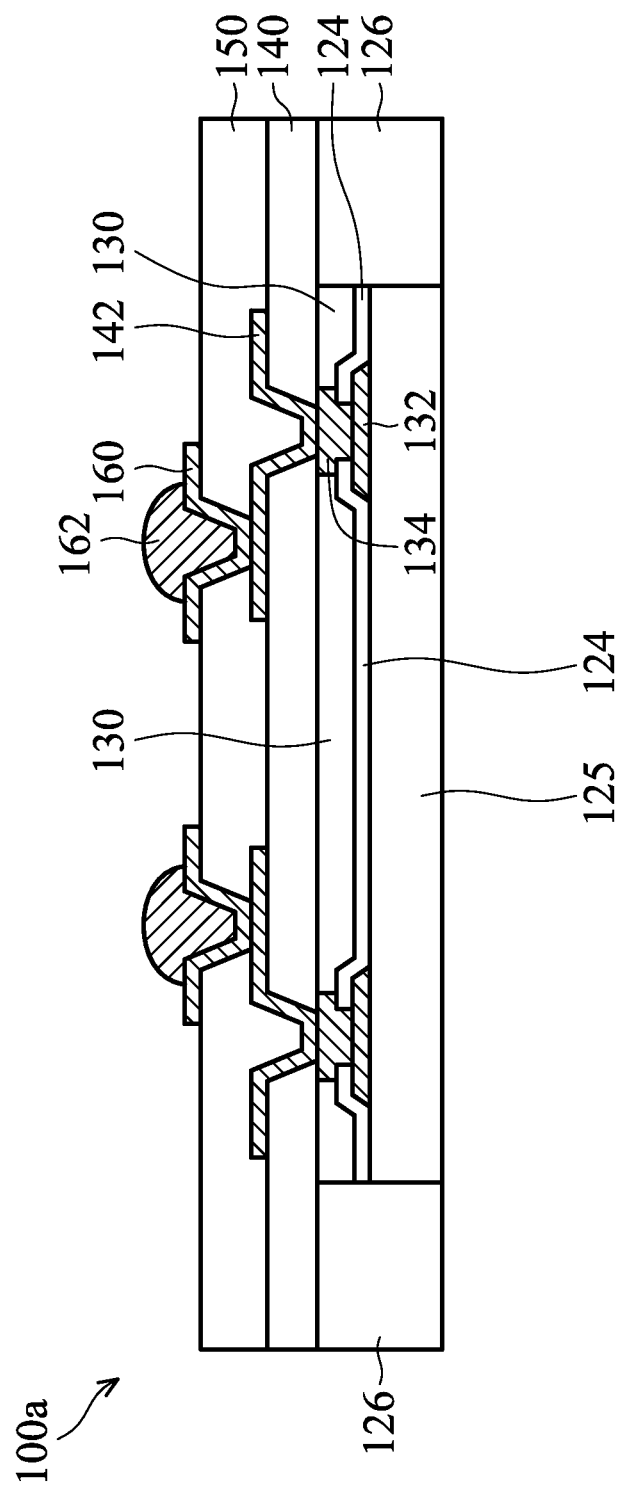

After the openings 157 are formed, a under bump metal-lurgy (UBM) layer 160 is formed in the first moisture-resistant layer 150 and a conductive structure 162 is formed on the UBM layer 160 as shown in FIG. 1F, in accordance with some embodiments of the disclosure. The conductive structure 162 is electrically connected to the PPI structure 142 by the UBM layer 160.

The UBM layer 160 may be made of conductive material, such as copper (Cu), copper alloy, aluminum (Al), aluminum alloy, tungsten (W), tungsten alloy, titanium (Ti), titanium alloy, tantalum (Ta) or tantalum alloy. In addition, the UBM layer 160 may contain an adhesion layer and/or a wetting layer. In some embodiments, the UBM layer 160 further includes a copper seed layer.

The conductive structure 162 is a ball-like bump or a pillar. The conductive structure 162 is made of conductive materials, such as tin (Sn), copper (Cu), gold (Au), silver (Ag), alloys thereof, or other suitable materials. In some embodiments, a solder paste is used to enhance the adhesive strength between the UBM layer 205 and the conductive structure 162.

FIG. 1F' shows a modified embodiment of a semiconductor device structure 100a, in accordance with some embodiments of the disclosure. An insulating layer 126, such as a molding compound is formed adjacent to the inter-metal dielectric (IMD) layer 120. In some embodiments, a chip structure 125, such as a silicon die or a chip including the semiconductor device 100a or 100b, is surrounded or enclosed by the insulating layer 126. The insulating layer 126 is covered by the first moisture-resistant layer 150 and therefore can be protected from moisture.

Figure 2A:
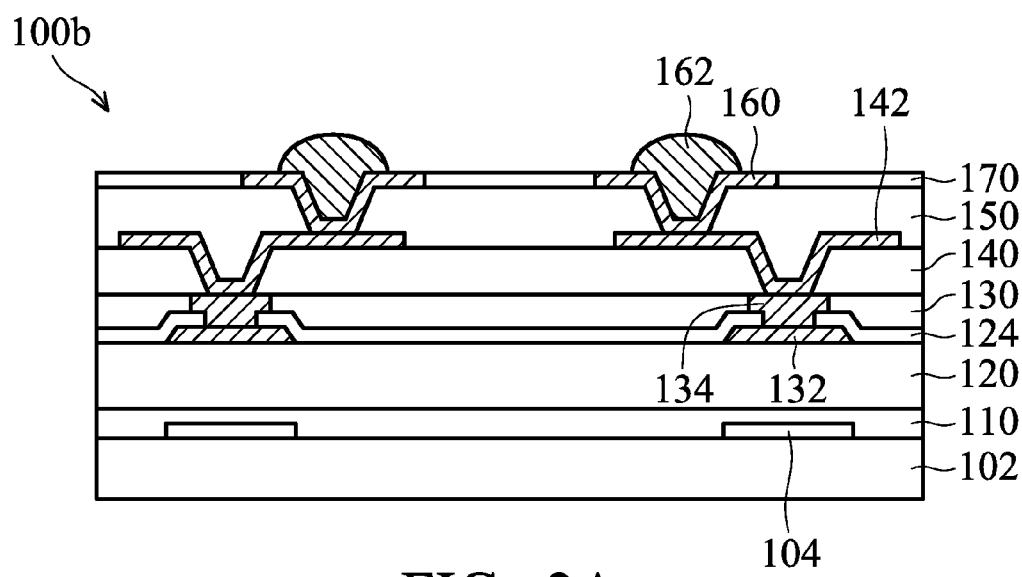
FIG. 2A shows a cross-sectional representation of a semiconductor device structure, in accordance with some embodiments of the disclosure.

FIG. 2A shows a cross-sectional representation of a semiconductor device structure 100b, in accordance with some embodiments of the disclosure. The semiconductor device structure 100b is similar to, or the same as, the semiconductor device structure 100a shown in FIG. 1F, except a second moisture-resistant layer 170 is formed over the first moisture-resistant layer 150. Processes and materials used to form semiconductor device structure 100b may be similar to, or the same as, those used to form the semiconductor device structure 100a and are not repeated herein.

The second moisture-resistant layer 170 is formed adjacent to and in direct contact with the UBM layer 160. In some embodiments, the second moisture layer 170 has a thickness that is substantially the same as or greater than the UBM layer 160. The second moisture-resistant layer 170 may include polyimide (PI), epoxy, solder resist (SR), silicon nitride, silicon oxide, HMDS (hexamethyldisilazane), fluorine-containing polymer or combinations thereof. In some embodiments, the second moisture-resistant layer 170 is formed of the same material as the first moisture-resistant layer 150.

Figure 2B:
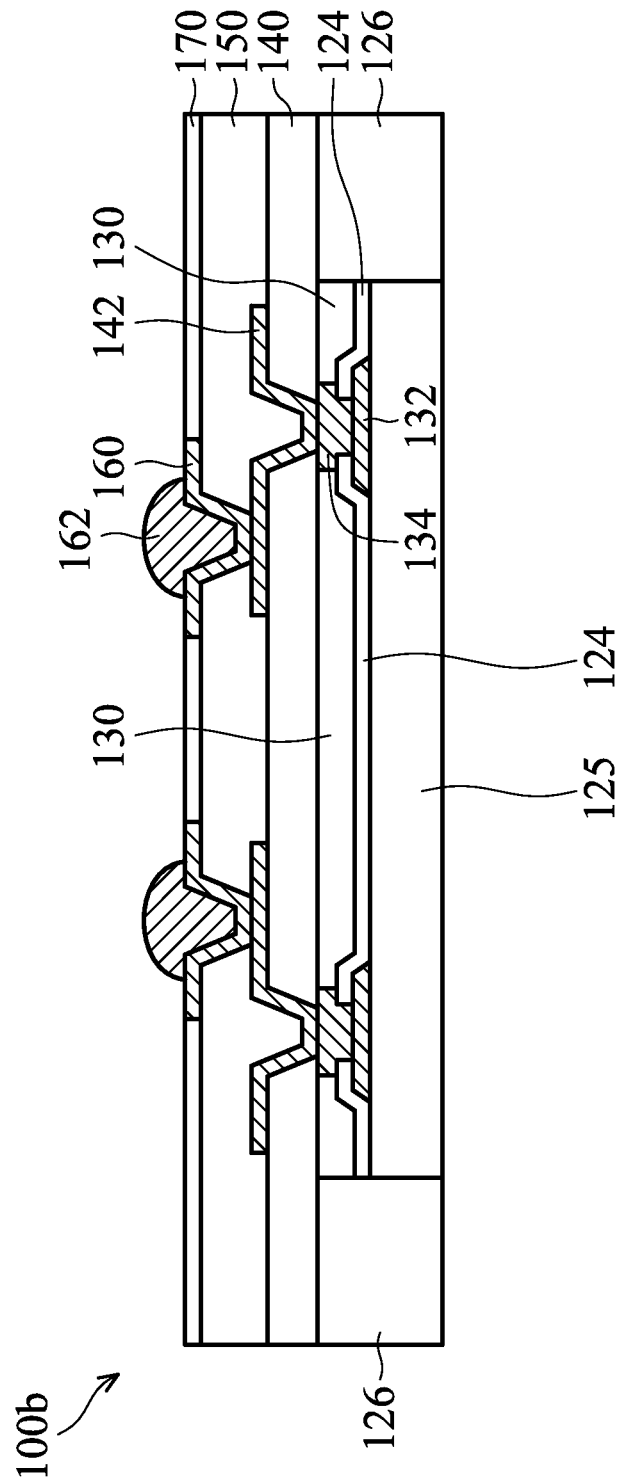
FIG. 2B shows a modified embodiment of a semiconductor device structure, in accordance with some embodiments of the disclosure.

FIG. 2B shows a modified embodiment of a semiconductor device structure 100b, in accordance with some embodiments of the disclosure. The insulating layer 126 is formed adjacent to the inter-metal dielectric (IMD) layer 120. In some embodiments, the chip structure 125 is surrounded or enclosed by the insulating layer 126. The insulating layer 126 is covered by the first moisture-resistant layer 150 and therefore can be protected from moisture.

FIGS. 3A-3D show cross-sectional representations of various stages of forming a semiconductor device structure 100c, in accordance with some embodiments of the disclosure.

Figure 3A:
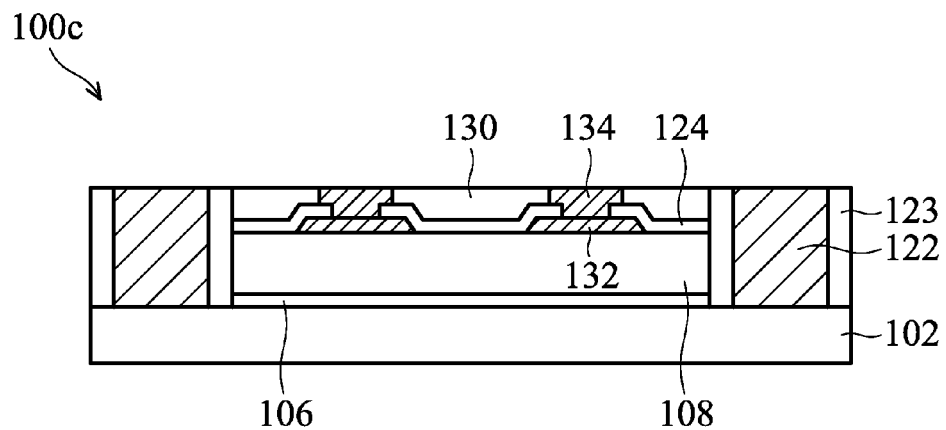
FIGS. 3A-3D show cross-sectional representations of various stages of forming a semiconductor device structure, in accordance with some embodiments of the disclosure.

As shown in FIG. 3A, an adhesion layer 106 is formed on the substrate 102, and a chip structure 108 is formed over the adhesion layer 106. In some embodiments, the chip structure 108 includes the semiconductor device structure 100a or 100b. The conductive pillar structures 122 are formed adjacent to the chip structure 108. The insulating layer 123 surrounds the sidewalls of the conductive pillar structures 122 and separates the conductive pillar structures 122 to the chip structure 108. In some embodiments, the insulating layer 123 includes silicon oxide, silicon nitride, an oxide of the conductive pillar structure 122, a molding compound or a combination thereof.

The conductive pillar structures 122 are used to connect to another package structure. The conductive pillar structures 122 are made of copper (Cu), gold (Au), silver (Ag), or other applicable materials.

The conductive pad 132 is formed over the chip structure 108 and is used to transfer the signal of the chip structure 108 to outer elements. The passivation layer 124 is formed over the chip structure 108. A portion of the passivation layer 124 extends to form between the conductive pad 132 and the PPI pad 134.

As shown in FIG. 3A, a top surface of the conductive pillar structures 122 is level with a top surface of the PPI pad 134. In addition, a top surface of the first protection layer 130 is substantially level with the top surface of the conductive pillar structures 122.

Figure 3B:
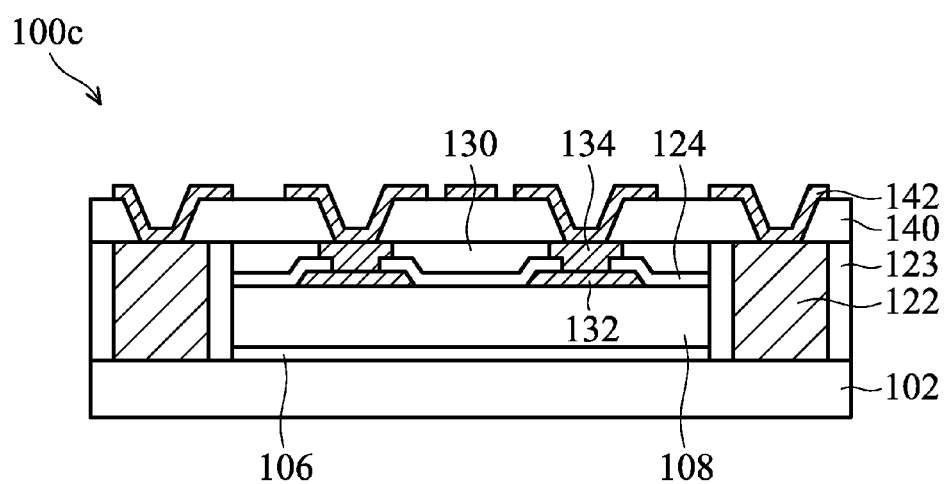

Afterwards, the second protection layer 140 is formed over the conductive pillar structures 122 and the first protection layer 130 as shown in FIG. 3B, in accordance with some embodiments of the disclosure. The PPI structure 142 is formed in the second protection layer 140. The PPI structure 142 is electrically connected to the PPI pad 134.

Figure 3C:
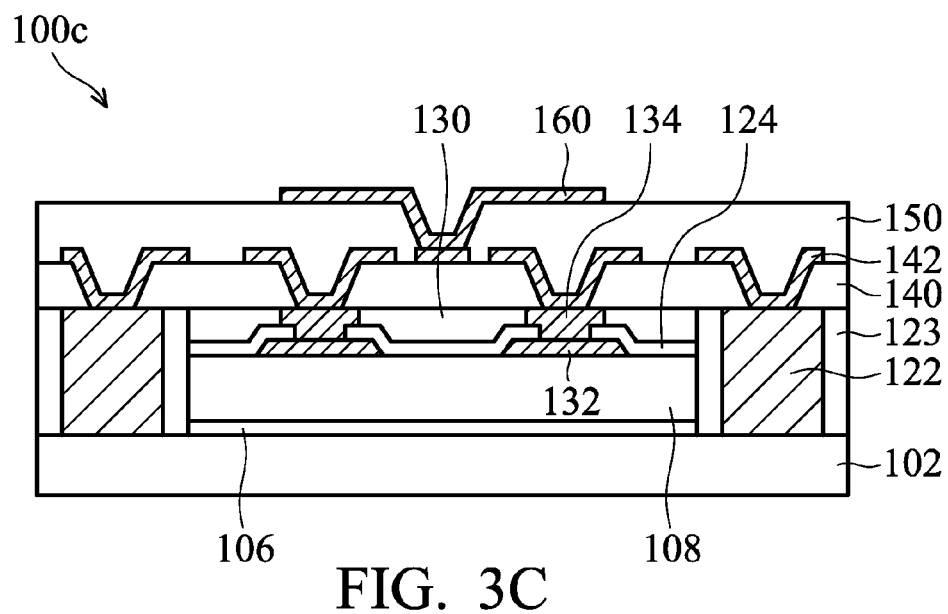

After the PPI structure 142 is formed, the first moisture-resistant layer 150 is formed over the second protection layer 140 and the PPI structure 142 as shown in FIG. 3C, in accordance with some embodiments of the disclosure. Afterwards, the UBM layer 160 is formed in the first moisture-resistant layer 150.

Figure 3D:
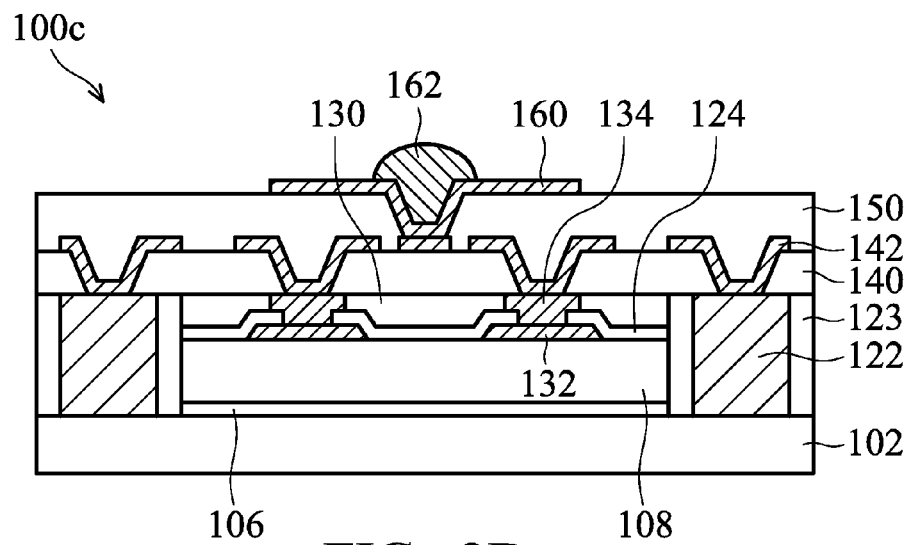
Figure 3D:
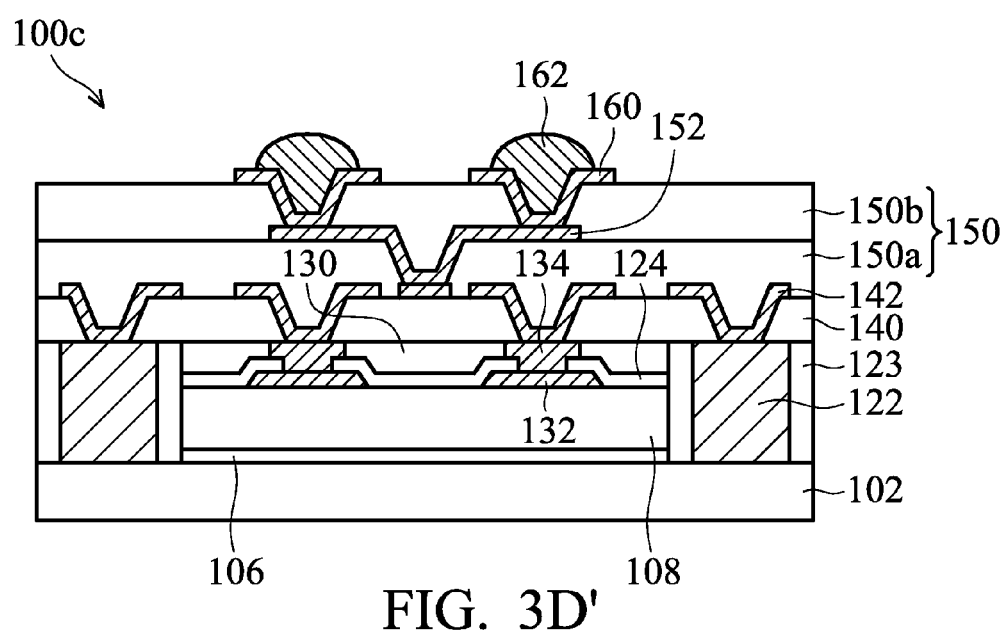

After the UBM layer 160 is formed, the conductive structure 162 is formed over the UBM layer 160 as shown in FIG. 3D, in accordance with some embodiments of the disclosure.

FIG. 3D' shows a modified embodiment of a semiconductor device structure 100c, in accordance with some embodiments of the disclosure. The first moisture-resistant layer 150 includes a first sub-layer 150a and a second sub-layer 150b for allowing more than one level of the PPI structure to be formed in the first moisture-resistant layer 150. In some embodiments, the first portion 150a and the second portion 150b are made of different materials.

Figure 4A:
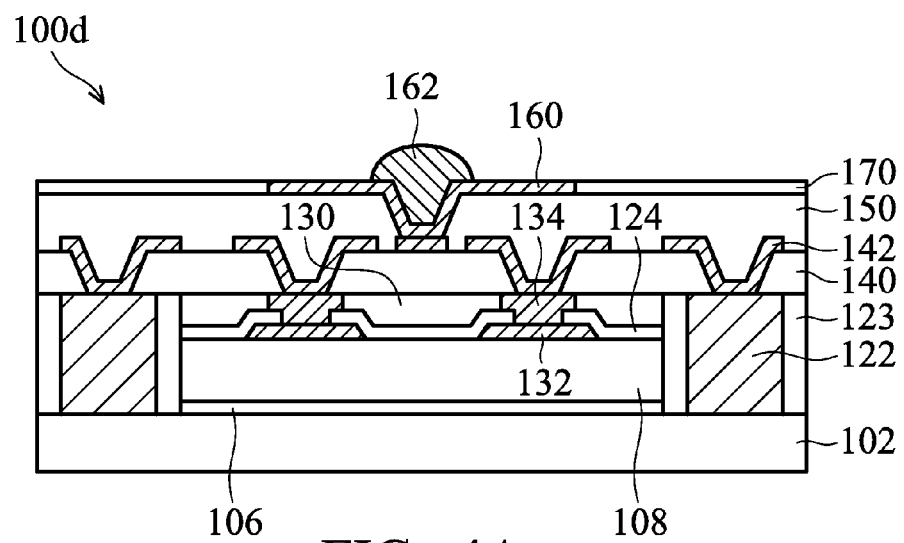
FIG. 4A shows a cross-sectional representation of a semiconductor device structure, in accordance with some embodiments of the disclosure.

FIG. 4A shows a cross-sectional representation of a semiconductor device structure 100d, in accordance with some embodiments of the disclosure. The semiconductor device structure 100d is similar to, or the same as, the semiconductor device structure 100a shown in FIG. 1F, except the second moisture-resistant layer 170 is formed over the first moisture-resistant layer 150. Processes and materials used to form semiconductor device structure 100d may be similar to, or the same as, those used to form the semiconductor device structure 100a and are not repeated herein.

Figure 4B:
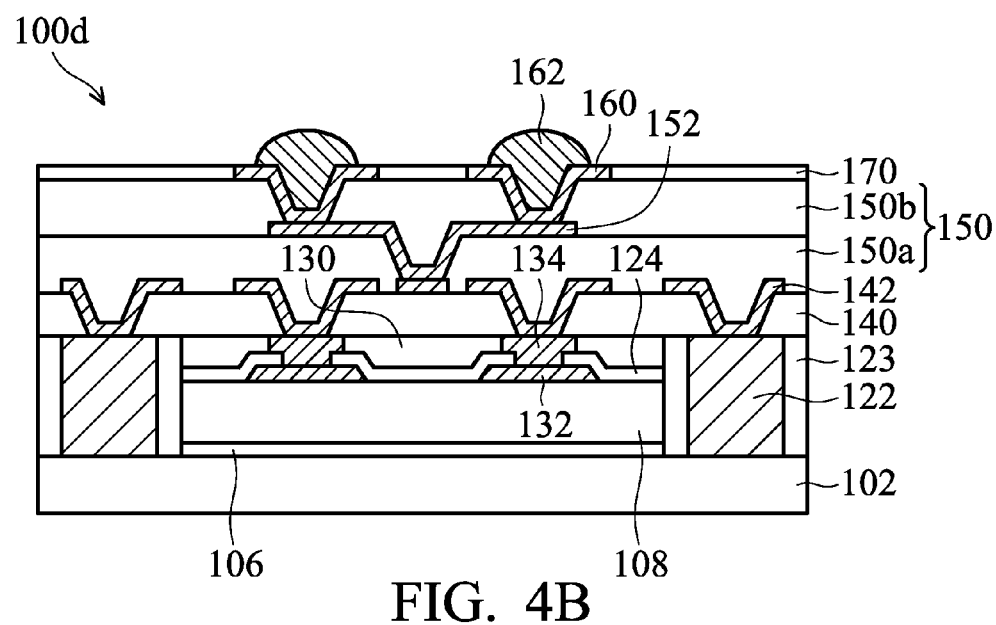
FIG. 4B shows a cross-sectional representation of a semiconductor device structure, in accordance with some embodiments of the disclosure.

FIG. 4B shows a cross-sectional representation of a semiconductor device structure 100d, in accordance with some embodiments of the disclosure. The second moisture-resistant layer 170 is formed over the second sub-layer 150b of the first moisture-resistant layer 150 and is in direct contact with the UBM layer 160.

Figure 5A:
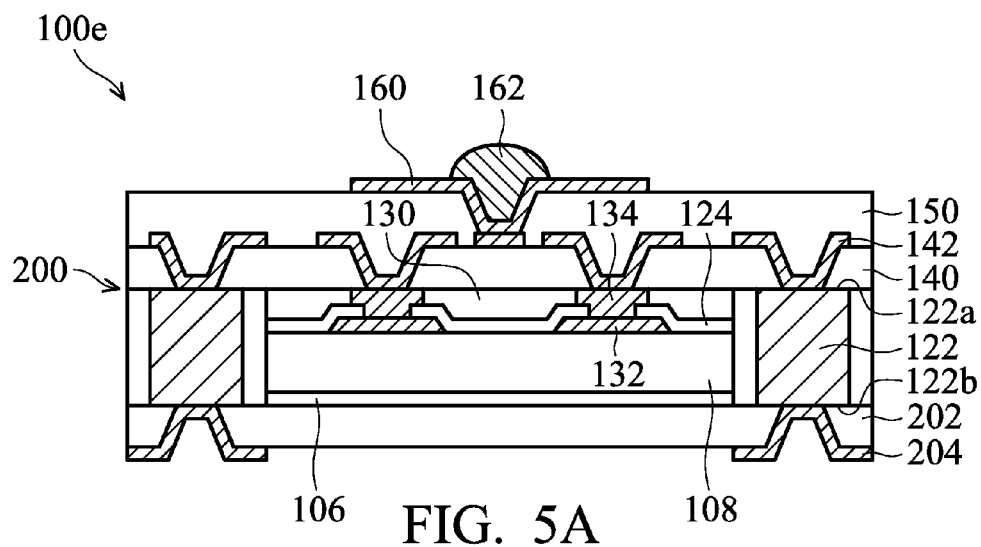
FIGS. 5A-5C show cross-sectional representations of various stages of forming a semiconductor device structure, in accordance with some embodiments of the disclosure.
Figure 5B:
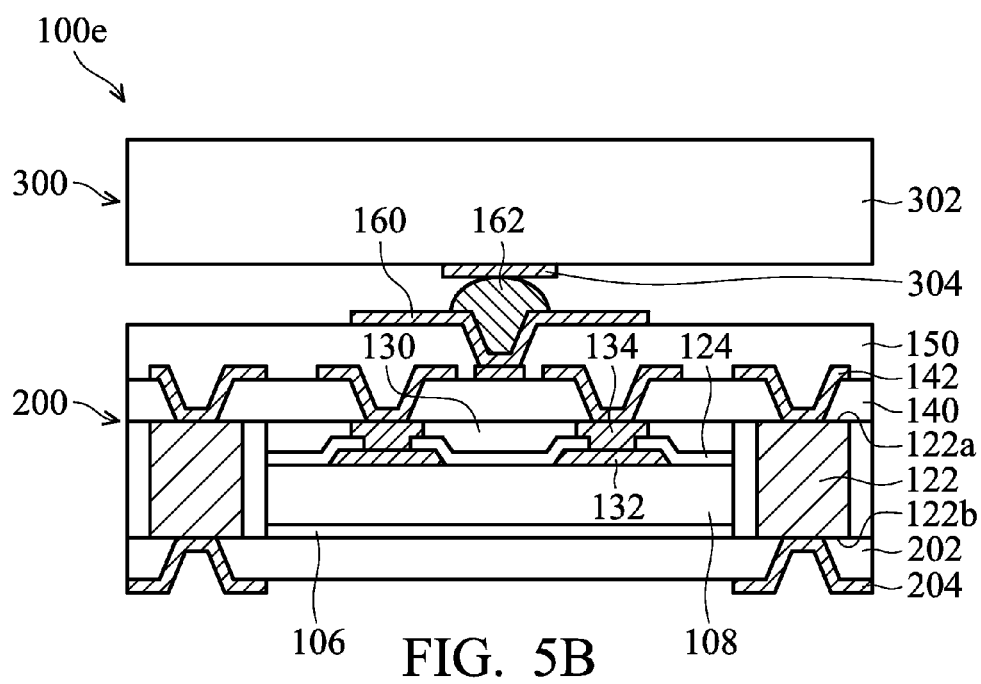
Figure 5B:
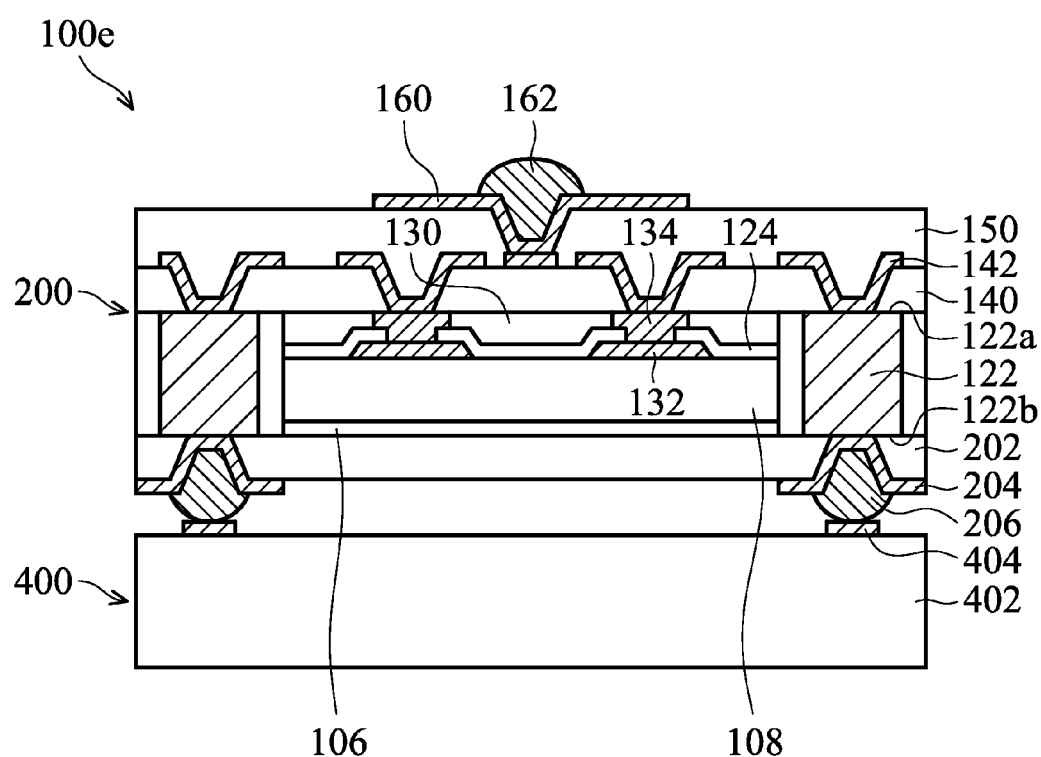

FIGS. 5A-5B show cross-sectional representations of various stages of forming a semiconductor device structure 100e, in accordance with some embodiments of the disclosure. FIGS. 5A-5B show the package on package (PoP) structure.

As shown in FIG. 5A, the substrate 102 is removed. A backside RDL (redistribution layer) 202 is formed on the backside of chip structure 108. The backside RDL 202 includes a conductive layer 204 formed over the conductive pillars 122. In some embodiments, the conductive layer 204 includes a UBM layer. In some other embodiments, the conductive layer 204 includes a pre-solder layer.

After the FIG. 5A, two different processes may be performed. In some embodiments, as shown in FIG. 5B, the first package structure 300 is first formed over the conductive structure 162. Alternatively, in some other embodiments, as shown in FIG. 5B', the second package structure 400 is first formed over the conductive layer 204.

In some embodiments, as shown in FIG. 5B, a first package structure 300 is first formed over the conductive structure 162. The first package structure 300 includes a conductive pad 304 formed on a substrate 302. Some device elements (not shown) are formed in the substrate 302. The first package structure 300 and a semiconductor device structure 200 with conductive pillar structures 122 are bonded to each other via the conductive pad 304 and the conductive structure 162. Therefore, the PoP structure is obtained.

The conductive pillar structures 122 have a first surface 122a and a second surface 122b opposite to the first surface 122a. The first surface 122a is in direct contact with the PPI structure 142, and the second surface 122b is in direct contact with the conductive layer 204.

In some other embodiments, as shown in FIG. 5B', a second package structure 400 is first formed over the second surface 122b of the conductive pillar structures 122 in accordance with some embodiments of the disclosure. A conductive structure 206 is formed over the conductive layer 204.

The second package structure 400 includes a substrate 402 and a conductive pad 404 formed over the substrate 402. Some device elements (not shown) are formed in the substrate 402. The second package structure 400 and the semiconductor device structure 200 with conductive pillar structures 122 are bonded to each other via the conductive pad 404 and the conductive structure 206.

Figure 5C:
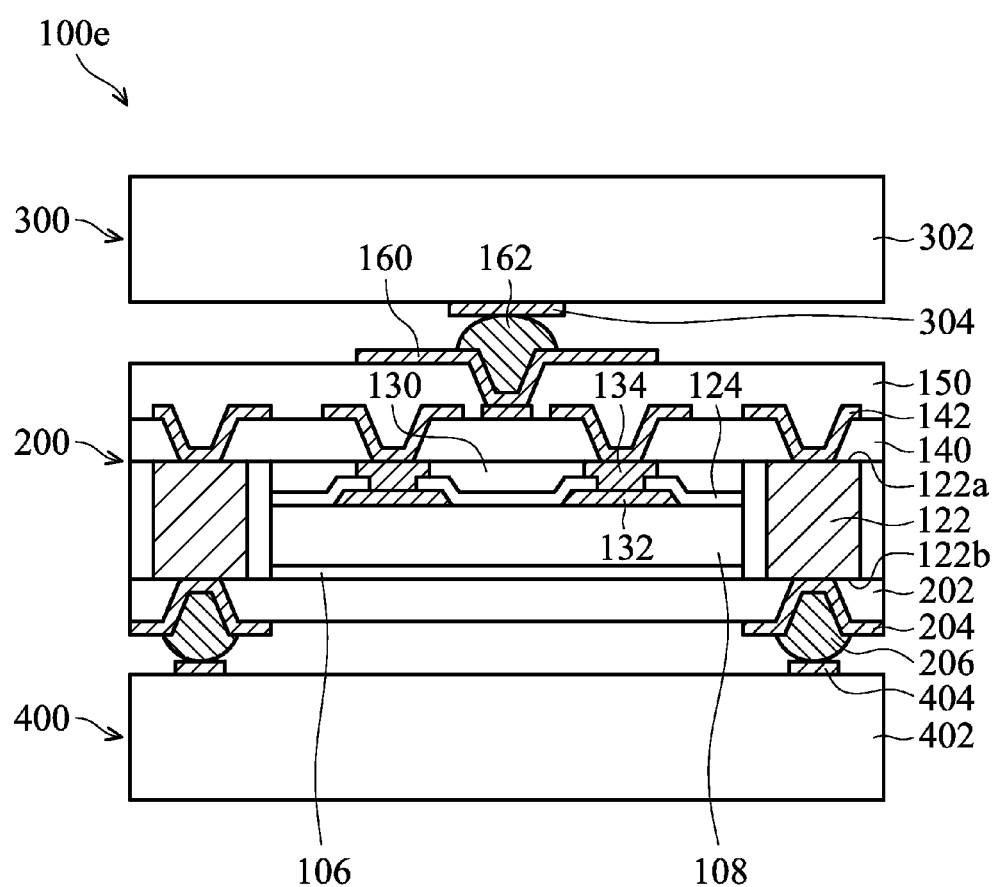

After the first package structure 300 and the second package structure 200 are sequentially formed over the semiconductor device structure 200, the PoP structure is obtained, as shown in FIG. 5C, in accordance with some embodiments of the disclosure.

Figure 6A:
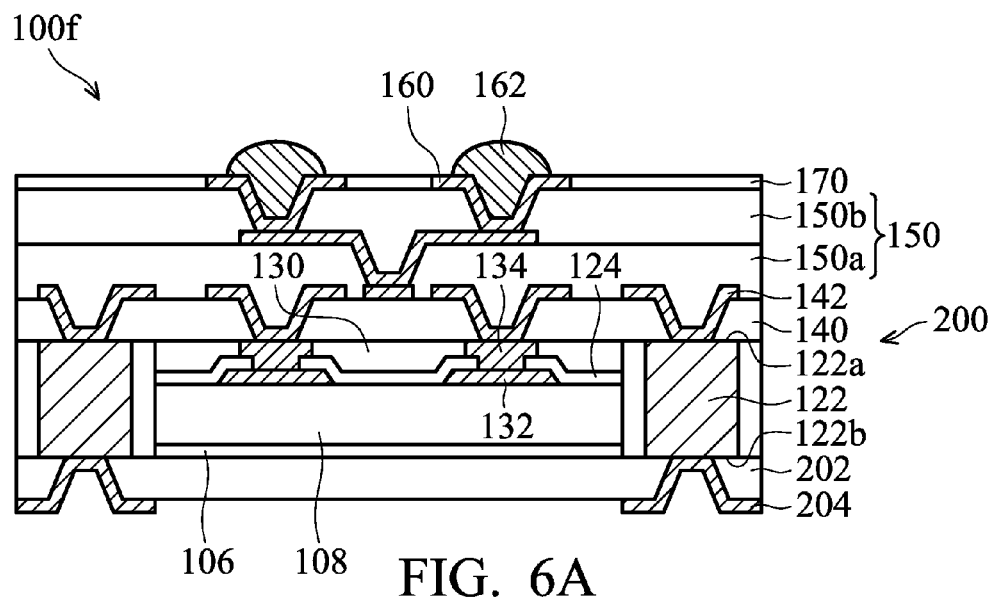
FIGS. 6A-6C show cross-sectional representations of various stages of forming a semiconductor device structure, in accordance with some embodiments of the disclosure.
Figure 6B:
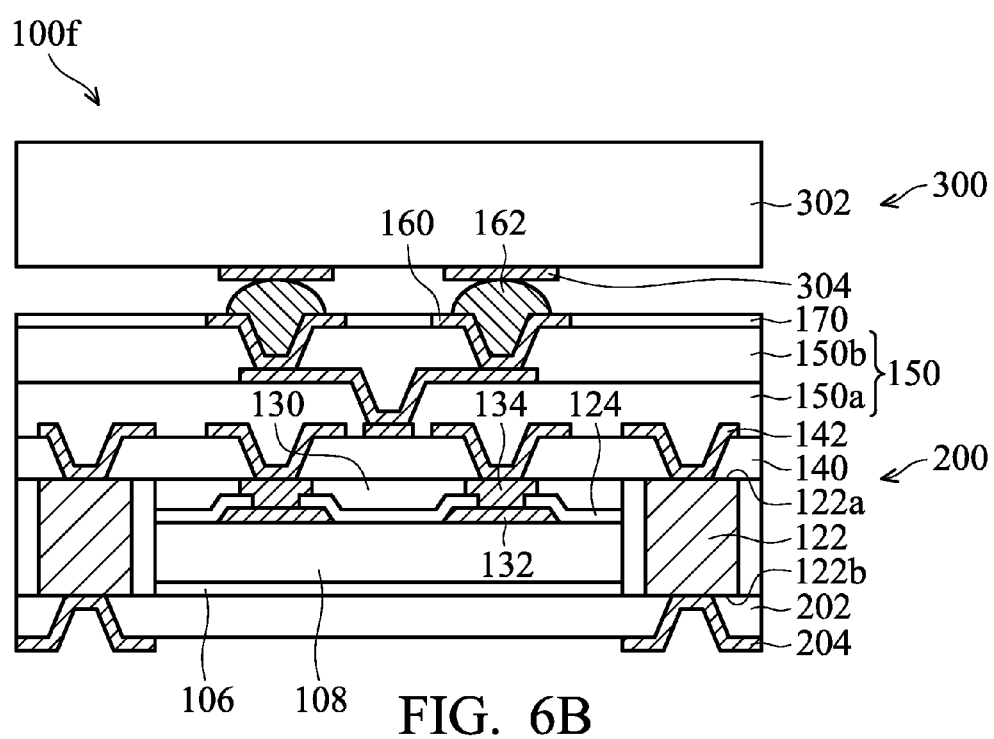
Figure 6B:
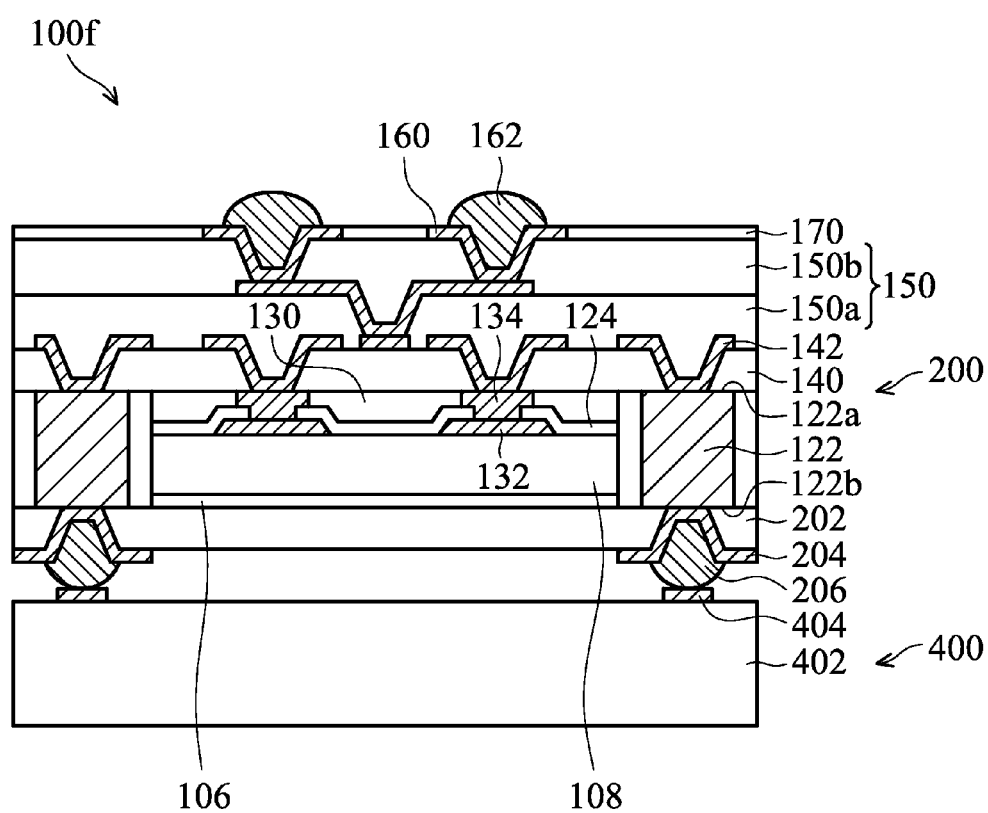
Figure 6C:
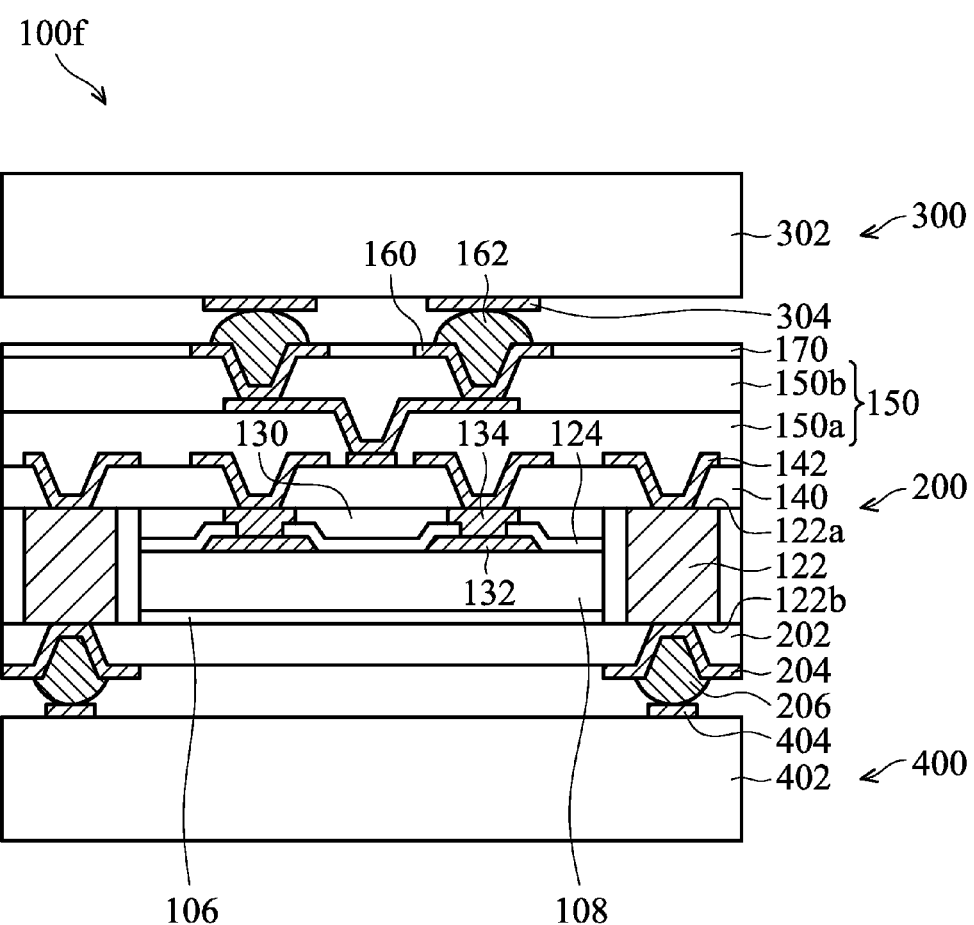

FIGS. 6A-6C show cross-sectional representations of various stages of forming a semiconductor device structure 100f, in accordance with some embodiments of the disclosure.

Referring to FIG. 6A, the first moisture-resistant layer 150 includes a first sub-layer 150a and a second sub-layer 150b. The second moisture-resistant layer 170 is formed over the second portion 150b of the first moisture-resistant layer 150 and adjacent to the UBM layer 160.

In some embodiments, as shown in FIG. 6A, the first package structure 300 includes a substrate 302 and a conductive pad 304 formed over the substrate 302. The conductive structure 162 is electrically connected to the conductive pad 304.

In some other embodiments, as shown in FIG. 6B', a second package structure 400 is first formed over the second surface 122b of the conductive pillar structures 122 in accordance with some embodiments of the disclosure.

After the first package structure 300 and the second package structure 400 are formed over the semiconductor device structure 200, the PoP structure is obtained as shown in FIG. 6C, in accordance with some embodiments of the disclosure.

As mentioned above, the first moisture-resistant layer 150 is at the outermost or top location relative the substrate 102 and it is made of moisture/water resistant layer. The first moisture-resistant layer 150 has excellent moisture/water resistant, and thus the delamination problem is prevented. In addition, the first moisture-resistant layer 150 also has excellent mechanical properties to prevent cracking.

Figure 7A:
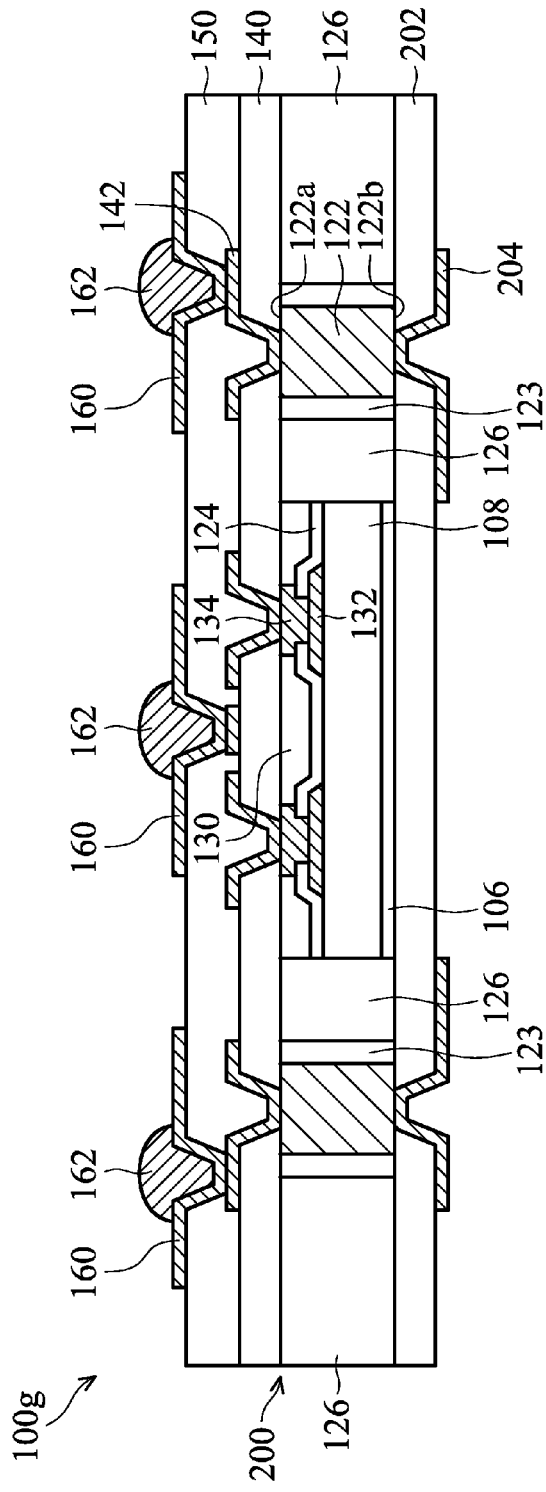
FIGS. 7A-7C show cross-sectional representations of various stages of forming a semiconductor device structure, in accordance with some embodiments of the disclosure.
Figure 7B:
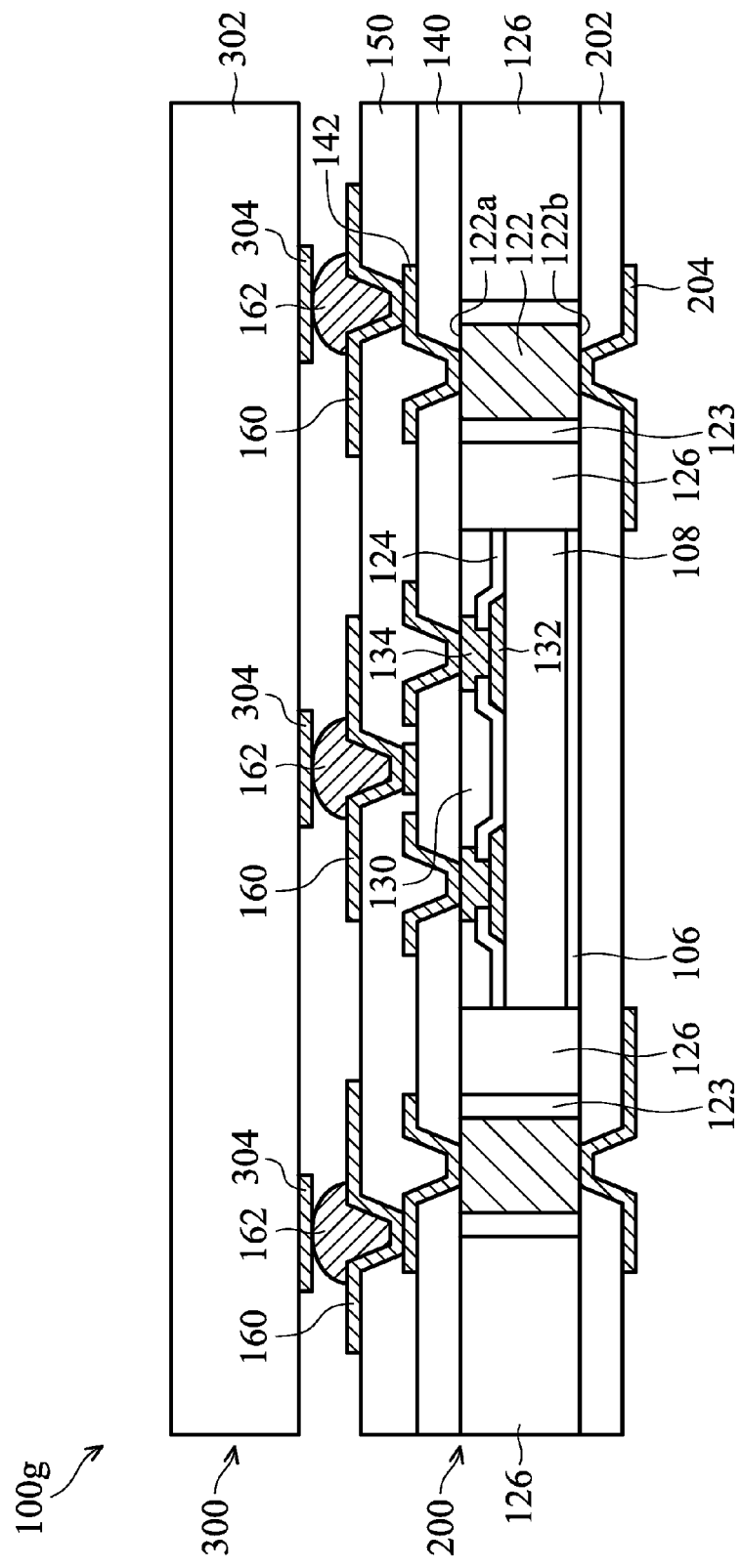
Figure 7B:
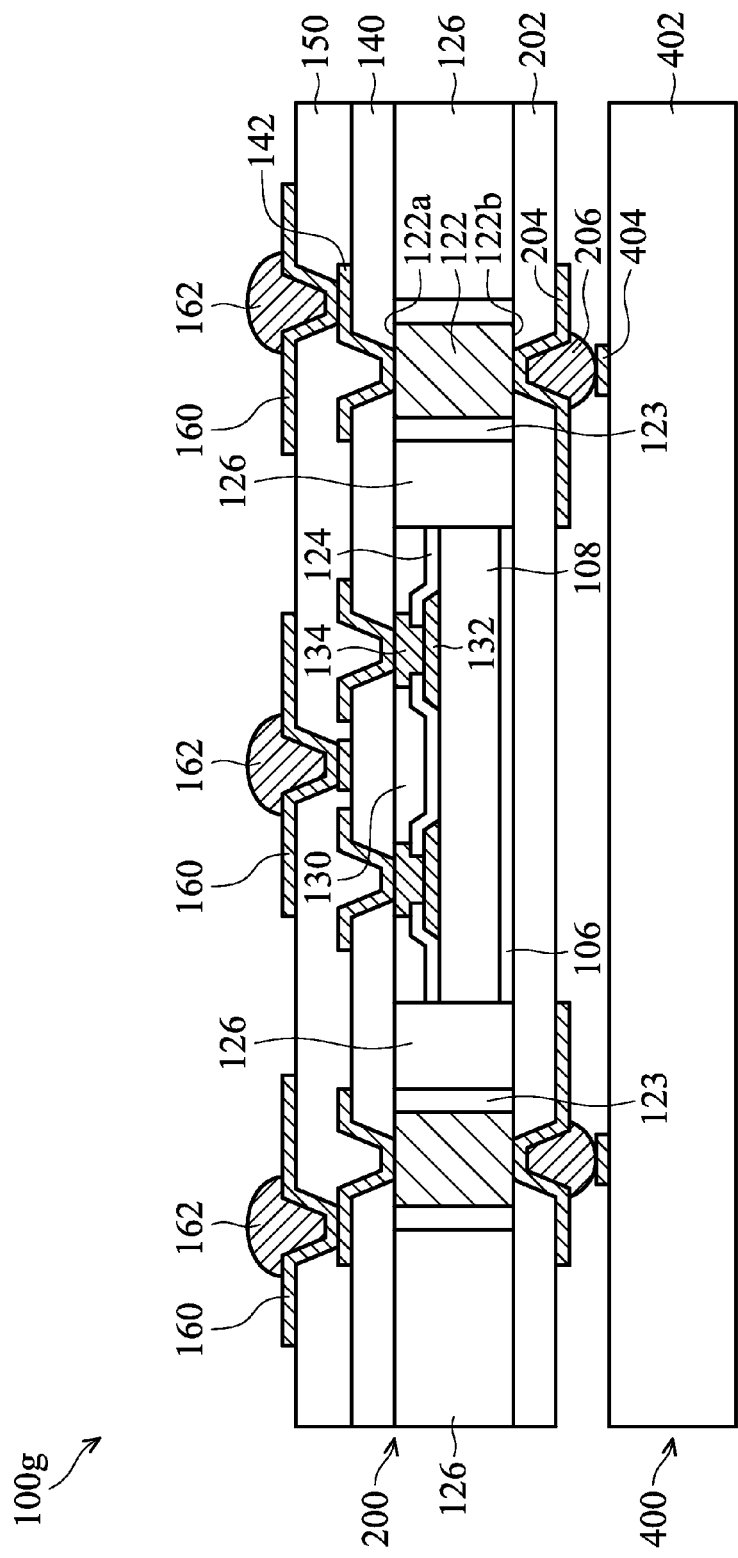
Figure 7C:
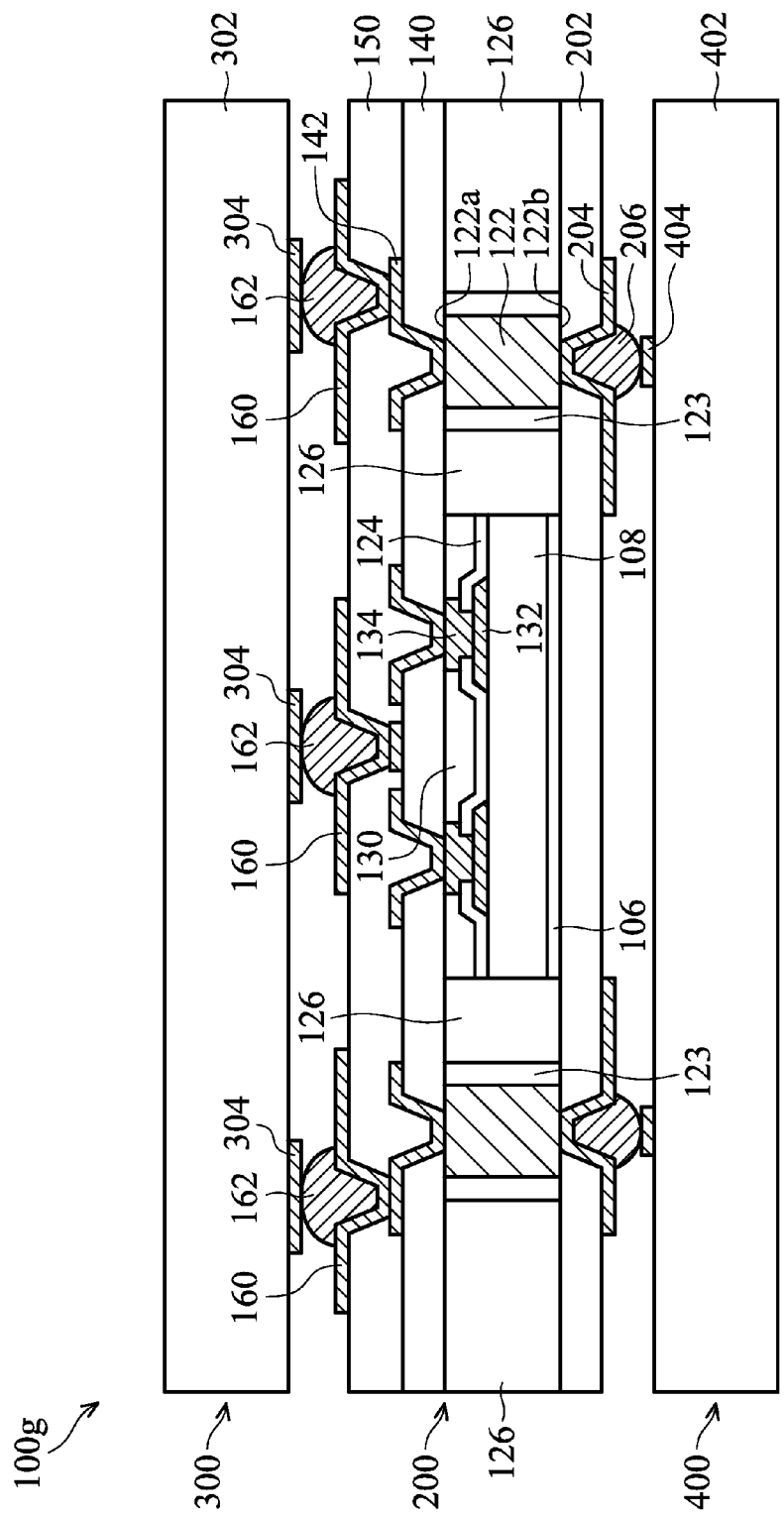

FIGS. 7A-7C show cross-sectional representations of various stages of forming a semiconductor device structure 100g, in accordance with some embodiments of the disclosure. FIGS. 7A-7C show a fan-out wafer level package. The fan-out wafer level package means the I/O pads on the chip structure can be distributed to a greater area then the chip structure, and hence the number of I/O pads on the surface of the chip structure can be increased.

As shown in FIG. 7A, the insulating layers 126 are formed adjacent to the chip structure 108 and the insulating layers 123. The conductive pillar structures 122 are formed between the insulating layers 126. In some other embodiments, the insulating layers 123 are omitted.

In some embodiments, as shown in FIG. 7B, the first package structure 300 is first formed over the conductive structure 162.

In some other embodiments, as shown in FIG. 7B', the second package structure 400 is first formed over the UBM layer 204.

After the FIG. 7B or FIG. 7B', another package structure is formed, and therefore the PoP structure including first package structure 300, the package structure 200 and the second package structure 400 are obtained.

Embodiments for forming a semiconductor device structure and method for formation the same are provided. A semiconductor device structure includes a conductive pad over a substrate, and a first protection layer over the conductive pad. A PPI structure is formed in the first protection layer and a first moisture-resistant layer is formed over the first protection layer. A UBM layer is formed in the first moisture-resistant layer. The first moisture-resistant layer and the first protection layer are made of different materials. The first moisture-resistant layer has good moisture resistant, and it prevents the device elements from being damaged. In addition, the problem of delamination of the PPI structure is prevented. The first moisture-resistant layer is used as a stress buffer layer to prevent cracking or warpage. Therefore, the performance of the semiconductor device structure is improved.

In some embodiments, a semiconductor device structure is provided. The semiconductor device structure includes a substrate and a conductive pad formed on the substrate. The semiconductor device structure includes a protection layer formed over the conductive pad and a post-passivation interconnect (PPI) structure formed at least in the protection layer. The PPI structure is electrically connected to the conductive pad. The semiconductor device structure also includes a first moisture-resistant layer formed over the protection layer, and the protection layer and the first moisture-resistant layer are made of different materials. The semiconductor device structure further includes an under bump metallurgy (UBM) layer formed over the first moisture-resistant layer and connected to the PPI structure.

In some embodiments, a semiconductor device structure is provided. The semiconductor device structure includes a conductive pad formed over a chip and an insulating layer surrounding the chip. The semiconductor device structure includes a protection layer formed over the conductive pad and the insulating layer and a post-passivation interconnect (PPI) structure at least formed in the protection layer. The PPI structure is electrically connected to the conductive pad. The semiconductor device structure further includes a first moisture-resistant layer formed over the protection layer, and the first moisture-resistant layer includes polyimide (PI), epoxy, solder resist (SR), silicon nitride, silicon oxide, HMDS (hexamethyldisilazane), fluorine-containing polymer or combinations thereof. The semiconductor device structure includes an under bump metallurgy (UBM) layer formed over the first moisture-resistant layer.

In some embodiments, a method for forming a semiconductor device structure is provided. The method includes forming a conductive pad over a substrate and forming a protection layer formed over the conductive pad. The method also includes forming a post-passivation interconnect (PPI) structure in the protection layer, and the PPI structure is electrically connected to the conductive pad. The method further includes forming a first moisture-resistant layer over the protection layer, and the protection layer and the first moisture resistant are made of different materials. The method includes forming an under bump metallurgy (UBM) layer in the first moisture-resistant layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate;
   a conductive pad formed on the substrate;
   a protection layer formed over the conductive pad;
   a post-passivation interconnect (PPI) structure and a PPI pad formed at least in the protection layer, wherein the PPI structure is electrically connected to the conductive pad, and the PPI structure is formed on the PPI pad;
   a first moisture-resistant layer formed over the protection layer, wherein the protection layer and the first moisture-resistant layer are made of different materials; and
   an under bump metallurgy (UBM) layer formed over the first moisture-resistant layer and connected to the PPI structure.

2. The semiconductor device structure as claimed in claim 1, wherein the first moisture-resistant layer comprises polyimide (PI), epoxy, solder resist (SR), silicon nitride, silicon oxide, HMDS (hexamethyldisilazane), fluorine-containing polymer or combinations thereof.

3. The semiconductor device structure as claimed in claim 1, wherein the protection layer is made of polybenzoxazole (PBO), and the first moisture-resistant layer is made of polyimide (PI), wherein the polyimide (PI) comprises cross-links with a range from about 10 wt % to about 40 wt %.

4. The semiconductor device structure as claimed in claim 1, further comprising:

a second moisture-resistant layer formed over the first moisture-resistant layer and adjacent to the UBM layer.

5. The semiconductor device structure as claimed in claim 4, wherein the second moisture-resistant layer is made of fluorine-containing polymer, wherein the fluorine-containing polymer comprises carbon-fluorine (C—F) bonds with a range from about 30 wt % to about 60 wt %.

6. The semiconductor device structure as claimed in claim 1, further comprising:
a conductive structure formed over the UBM layer, wherein the conductive structure is electrically connected to the PPI structure by the UBM layer.

7. The semiconductor device structure as claimed in claim 6, further comprising:
a package structure formed over the conductive structure, wherein the conductive structure is electrically connected to a conductive pad of the package structure.

8. The semiconductor device structure as claimed in claim 1, further comprising:
a passivation layer formed between the conductive pad and the PPI structure, wherein the passivation layer and the first moisture-resistant layer are made of the same material.

9. A semiconductor device structure, comprising:
a conductive pad formed over a chip;
an insulating layer surrounding the chip;
a protection layer formed over the conductive pad and the insulating layer;
a post-passivation interconnect (PPI) structure at least formed in the protection layer, wherein the PPI structure is electrically connected to the conductive pad;
a first moisture-resistant layer formed over the protection layer, wherein the first moisture-resistant layer comprises polyimide (PI), epoxy, solder resist (SR), silicon nitride, silicon oxide, HMDS (hexamethyldisilazane), fluorine-containing polymer or combinations thereof; and
an under bump metallurgy (UBM) layer formed over the first moisture-resistant layer.

10. The semiconductor device structure as claimed in claim 9, further comprising:
a passivation layer formed between the chip and the protection layer, wherein the passivation layer and the first moisture-resistant layer are made of the same material.

11. The semiconductor device structure as claimed in claim 9, wherein the solder resist (SR) comprises silicate fillers with a range from about 10 wt % to about 30 wt %.

12. The semiconductor device structure as claimed in claim 9, wherein the epoxy comprises phenol resin or acrylic resin with a range from about 60 wt % to about 90 wt %.

13. The semiconductor device structure as claimed in claim 9, further comprising:
a first conductive structure formed on the UBM layer; and
a first package structure formed over the first conductive structure.

14. The semiconductor device structure as claimed in claim 9, further comprising:
a conductive pillar structure formed through the insulating layer, wherein the conductive pillar structure comprises a first surface which is adjacent to the PPI structure and a second surface opposite to the first surface; and
a conductive layer formed over the second surface of the conductive pillar structure.

15. The semiconductor device structure as claimed in claim 14, further comprising:
a second conductive structure formed over the conductive layer; and
a second package structure formed over the second conductive structure.

16. The semiconductor device structure as claimed in claim 9, further comprising:
a second moisture-resistant layer formed over the first moisture-resistant layer, wherein the second moisture-resistant layer is adjacent to the UBM layer.

17. A method for forming a semiconductor device structure, comprising:
forming a conductive pad over a substrate;
forming a protection layer formed over the conductive pad;
forming a post-passivation interconnect (PPI) structure and a PPI pad in the protection layer, wherein the PPI structure is electrically connected to the conductive pad, and the PPI structure is formed on the PPI pad;
forming a first moisture-resistant layer over the protection layer, wherein the protection layer and the first moisture-resistant layer are made of different materials; and
forming an under bump metallurgy (UBM) layer in the first moisture-resistant layer.

18. The method for forming the semiconductor device structure as claimed in claim 17, further comprising:
forming a second moisture-resistant layer adjacent to the UBM layer, wherein the second moisture-resistant layer is made of fluorine-containing polymer.

19. The method for forming the semiconductor device structure as claimed in claim 17, further comprising:
forming a conductive structure over the UBM layer; and
forming a package structure over the conductive structure, wherein the package structure is electrically connected to the conductive structure.

20. The method for forming the semiconductor device structure as claimed in claim 17, further comprising:
forming a chip structure between the conductive pad and the substrate;
forming an insulating layer surrounding the chip; and
forming a conductive pillar structure through the insulating layer and adjacent to the chip structure.

* * * * *